United States Patent [19]

Shimizu

[11] Patent Number: 4,500,900
[45] Date of Patent: Feb. 19, 1985

[54] EMITTER BALLAST RESISTOR CONFIGURATION

[75] Inventor: Isao Shimizu, Takasaki, Japan

[73] Assignee: Hitachi, Ltd., Tokyo, Japan

[21] Appl. No.: 350,873

[22] Filed: Feb. 22, 1982

[30] Foreign Application Priority Data

Feb. 20, 1981 [JP] Japan ................. 56/23017

[51] Int. Cl.³ ............... H01L 29/72; H01L 27/02; H01L 29/06
[52] U.S. Cl. ..................... 357/36; 357/51; 357/20
[58] Field of Search ............ 357/36, 51, 34, 20

[56] References Cited

U.S. PATENT DOCUMENTS 3,358,197 12/1967 Scarlett .................. 357/36
3,971,060 7/1976 Leuschner ............... 357/36

FOREIGN PATENT DOCUMENTS 45-37365 11/1970 Japan ...................... 357/36

Primary Examiner—Andrew J. James
Assistant Examiner—John Lamont
Attorney, Agent, or Firm—Antonelli, Terry & Wands

[57] ABSTRACT

A power transistor having a collector region lying in one principal surface of a semiconductor body, a base region surrounded with the collector region and an emitter region surrounded with the base region, wherein the emitter region includes a main transistor operation portion, a ballast resistance portion and an electrode connection portion, and wherein the part of the base region surrounding the ballast resistance portion is narrower than the part of the base region surrounding the electrode connection portion.

13 Claims, 6 Drawing Figures

EMITTER BALLAST RESISTOR CONFIGURATION

BACKGROUND OF THE INVENTION

This invention relates to a semiconductor device, and more particularly to a power transistor which is contained in a high-output semiconductor integrated circuit (hereinbelow called "power IC").

In a power transistor in the power IC of an audio output circuit or the like, a plurality of emitter regions are arranged within a single base region in order to derive a high output current. In such a power transistor, ballast resistances are inserted between the respective emitter regions and the corresponding emitter input terminals so that emitter currents may flow uniformly through the respective emitter regions. Also, in order to make the occupied area of the whole power transistor small, it has been proposed to form each ballast resistance as a diffused resistance region with one end continuous with the original emitter region and the other end connected to an emitter input electrode.

Although such a power transistor as discussed above has a relatively small occupied area, it has the disadvantage that current crowds locally in the part of the ballast resistances proximate to the input electrodes, resulting in the breakdown of the transistor. Upon studying this breakdown, the inventor has found it is ascribable to the fact that the ballast resistance region proximate to the input electrode also effects a transistor operation. That is, in these studies it has been revealed that current becomes liable to crowding in a parasitic transistor whose emitter is the ballast resistance region, and that the local current crowding occurs in this part of the region with the result that the power transistor breaks down.

SUMMARY OF THE INVENTION

Accordingly, it is an object of the present invention to increase the breakdown strength of a power transistor which uses a part of an emitter region as an emitter ballast resistance.

To achieve this and other objects according to this invention, the surface of a base region extending along a ballast resistance is formed to be narrow on at least the base electrode side, thereby to increase the base resistance of a parasitic transistor.

DESCRIPTION OF THE PREFERRED EMBODIMENTS

Figure 1:
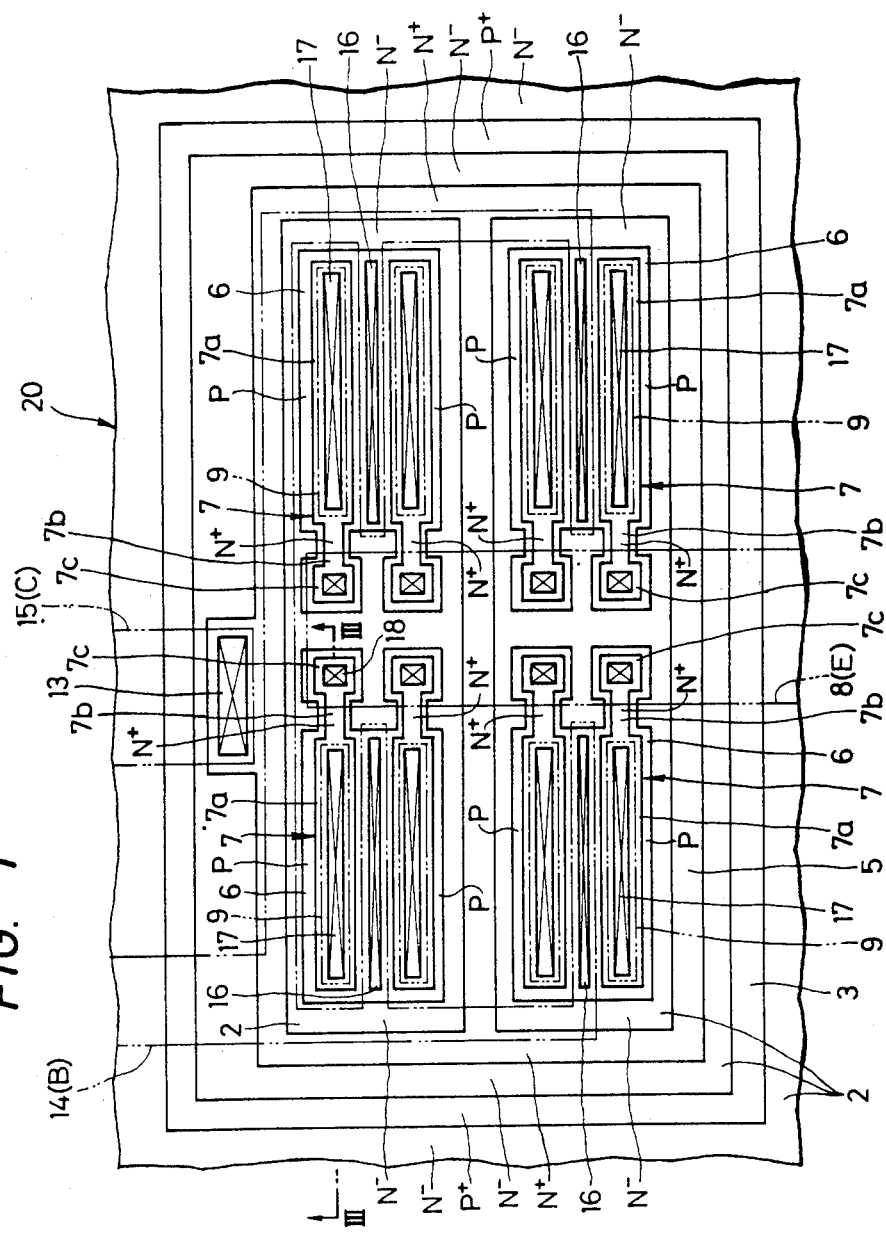
FIG. 1 is a plan view of a power transistor portion in a power IC embodying this invention.

Referring now to the drawings, FIG. 1 is a plan view showing the structure of a power transistor of this invention formed in a power IC. The power transistor is formed in a part of a silicon semiconductor wafer 20 which consists of a P-type semiconductor substrate and an $N^-$-type epitaxial layer 2 formed thereon by epitaxial growth. In particular, the power transistor is surrounded with a $P^+$-type isolation region 3 and is electrically isolated from circuit elements (not shown) to be formed in the other portion of the wafer 20.

Figure 2:
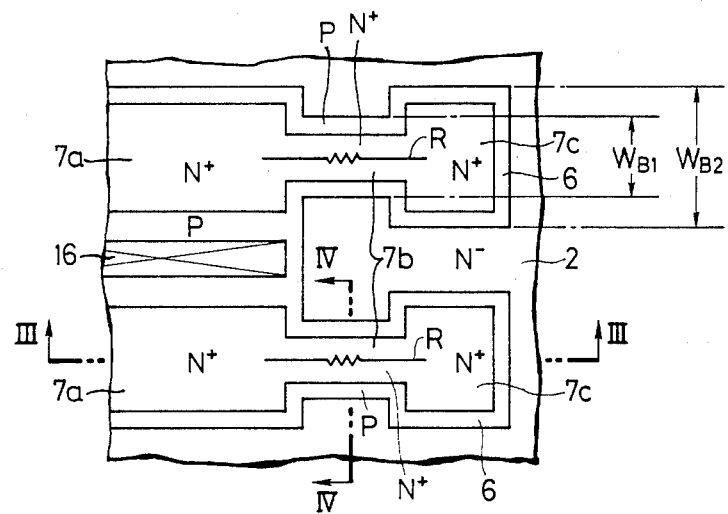
FIG. 2 is an enlarged plan view of essential parts in FIG. 1.
Figure 3:
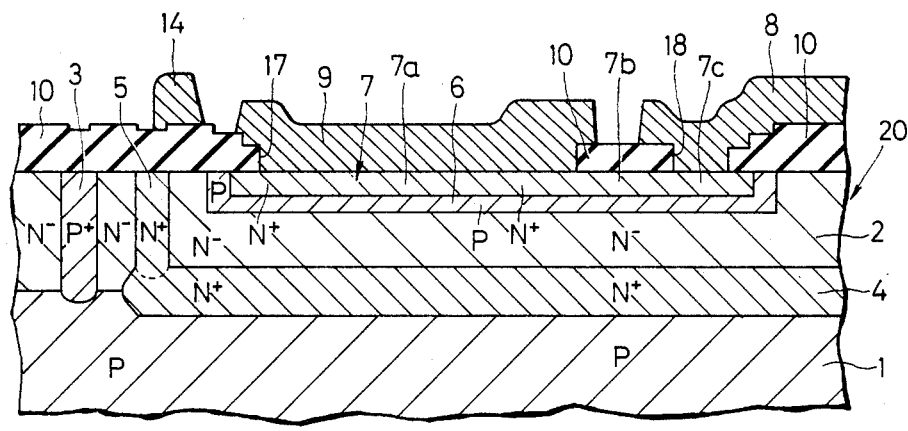
FIG. 3 is a sectional view taken along line III—III in FIG. 1 or FIG. 2.
Figure 4:
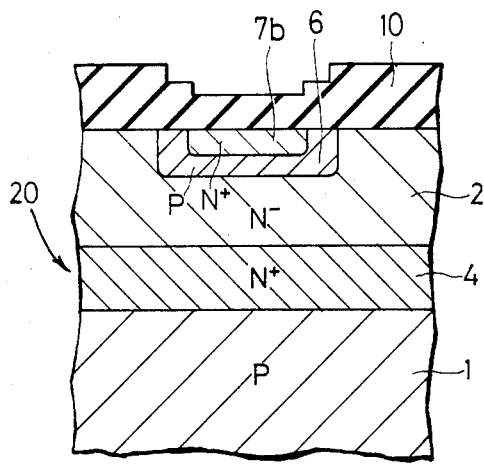
FIG. 4 is a sectional view taken along line IV—IV in FIG. 2.

As shown in FIG. 3, an $N^+$-type diffused region 5 which is deep enough to reach an $N^+$-type buried layer 4 and which serves to lead out a collector electrode is formed to be annular within the $N^-$-type epitaxial layer 2 which is surrounded with the isolation region 3. Within the $N^-$-type epitaxial layer 2 surrounded with the $N^+$-type diffused region 5, P-type base regions 6 are formed by the well-known diffusion technique. As illustrated in FIG. 1, four such base regions 6 are formed in the single island region 2. One pair of base regions adjacent to each other are surrounded with the $N^+$-type region 5. Within each base region 6, two $N^+$-type emitter regions 7 are formed by the well-known diffusion technique. As will be better understood from FIG. 2, each emitter region 7 is composed of an emitter portion 7a which is formed for the original transistor operation, a resistance portion 7b which acts as a ballast resistance, and an electrode lead-out portion 7c. A section taken along line IV—IV in FIG. 2 is shown in FIG. 4. As seen from FIG. 3, a metal electrode 8 of aluminum or the like is held in ohmic contact with the electrode lead-out portion 7c through a contact hole 18 provided in a silicon oxide film 10. As indicated by a two-dot chain line in FIG. 2, the electrode 8 is connected in common to the emitter regions through the corresponding contact holes 18 and forms an emitter input terminal. An emitter electrode 9 made of a metal such as aluminum is held in ohmic contact with the emitter portion 7a of the transistor operation portion through a contact hole 17. With the part of the base region 6 between the pair of emitter regions 7, a base electrode 14 made of a metal such as aluminum is held in ohmic contact through a contact hole 16 which is not formed along the resistance portions 7b. As indicated by a two-dot chain line in FIG. 1, the base electrode 14 is disposed so as to connect the base contact regions in common and thus forms a base input terminal. As indicated by a two-dot chain line in FIG. 1, a collector electrode 15 is led out from the collector lead-out regions 5 through contact holes 13 in a common fashion.

Figure 5:
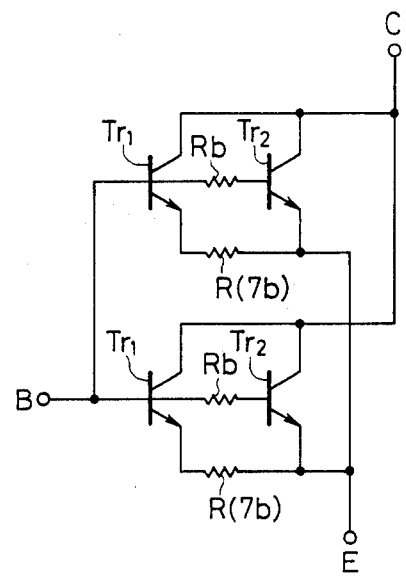
FIG. 5 is an equivalent circuit diagram in the case where two power transistors are formed with one base region.

FIG. 5 is an equivalent circuit diagram of transistors which are formed with a single base region such as described in the above-discussed power transistor arrangement. $Tr_1$ indicates the originally required transistor which is formed by the emitter portion 7a. $Tr_2$ indicates an undesirable parasitic transistor which is formed by the electrode lead-out portions 7c held in ohmic contact with the emitter electrode 8. In addition, letter R indicates the ballast resistance which is formed by the resistance portion 7b.

In order to minimize the effects of this parasitic transistor, an important aspect of the present invention is the particular configuration of the base region 6. Specifically, as illustrated in FIGS. 1 and 2, the base region 6 is formed on one principal surface of the semiconductor body to be narrow along the emitter ballast resistance portion 7b. That is, the width $W_{B1}$ of the base region part surrounding the emitter ballast resistance portion 7b is smaller than the width $W_{B2}$ of the base region part surrounding the emitter electrode lead-out portion 7c.

The base resistance indicated by Rb can be regarded as including in parallel the resistance component of the base region directly below the emitter region (7b, 7c) and the resistance component existing in the side surfaces of the emitter region (7b, 7c). However, since the base region extending along the emitter region (7b, 7c) is formed to be narrow in accordance with the present invention, only the base resistance directly below the region 7b need be considered. Since the impurity concentration of the base region underlying this emitter region is low, the base resistance Rb can be made very great. This resistance is permitted to act as the base resistance the parasitic resistance. As a result, the base-emitter voltage $V_{BE}$ of the parasitic transistor can be made small by a voltage drop across the base resistance Rb during the operation of the power transistor. The normal operation can therefore be performed by bringing only the original transistor $Tr_1$ into the "on" state without allowing the parasitic transistor to turn into the "on" state. That is, current can be effectively poured onto the original transistor side during the operation of the power transistor by substantially preventing the parasitic transistor from operating. Moreover, a uniform operation can be effected by preventing crowding by means of the ballast resistance R.

In order to operate the power transistor normally and to substantially prevent the parasitic transistor from operating as described above, the ballast resistance R needs to be designed in relation to the parasitic transistor so as to satisfy the formulas of $R<(Rb/h_{FE})(h_{FE}:$ current gain). In this case, usually $R\neq 1-2\Omega$ holds. Assuming $h_{FE}$ to be approximately 200, therefore, it may be established that $Rb>200-400\Omega$. Since, however, that base region directly under the region 7c which determines the base resistance Rb has a high resistance (10 k$\Omega/\square$) to the same extent as a pinch resistance, the base resistance Rb can be increased so as to obtain the formulas by appropriately laying out the peripheral shape of the base region. By way of example, the width of the base region 6 extending along the regions 7b and 7c may be approximately 5 $\mu$m. The width of the base region 6 can be made smaller at high precision by applying some of the base region-forming windows to the formation of the emitter regions. However, the base width generally should be made at least 1-2 $\mu$m or greater in order to prevent punch-through across the base region from the $N^+$-type region 7 to the $N^-$-type region 2.

As is apparent from the foregoing, the power transistor of this invention includes the feature that the base region extending along the ballast resistance portion is made especially narrow to increase the base resistance of the parasitic transistor. Therefore, the previously described current crowding to the parasitic transistor can be prevented. As a result of this, current can uniformly flow to the original transistor $Tr_1$ by the ballast resistance so that the breakdown strength of the power transistor can be enhanced and the action of the ballast resistance can be effectively carried out.

Figure 6:
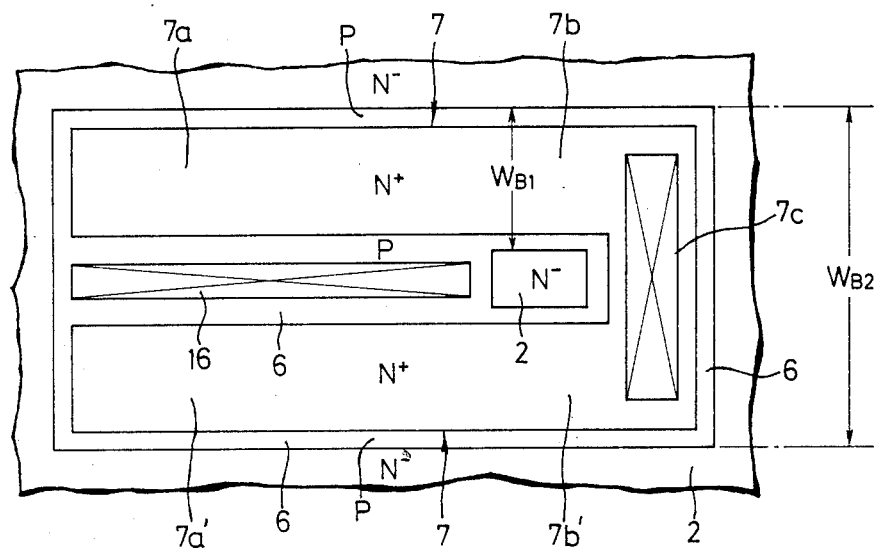
FIG. 6 is an enlarged plan view similar to FIG. 2, showing a power transistor portion in another embodiment.

FIG. 6 shows another embodiment of this invention, and illustrates the plan configuration of a power transistor.

In this example, an emitter region 7 which consists of two emitter operation portions 7a, 7a', emitter ballast resistance portions 7b, 7b' having substantially equal widths, and an electrode lead-out portion 7c is formed within a single base portion 6. An aluminum electrode which serves as an emitter input terminal is led out from the electrode lead-out portion 7c. On the other hand, the base region 6 surrounding the emitter ballast resistance portions 7b, 7b' and along a portion of the emitter electrode lead-out portion 7c is effectively reduced in width. This is accomplished by providing a portion of the $N^-$-type epitaxial layer 2 directly exposed to the substrate surface between the pair of resistance portions 7b and 7b' and between a base contact 16 and the electrode lead-out portion 7c. Thus, as in the foregoing embodiment, the width $W_{B1}$ of the base region part surrounding the emitter ballast resistance portions 7b and 7b' is smaller than the width $W_{B2}$ of the base region part surrounding the outer edges of emitter electrode lead-out portion 7c.

With the construction of FIG. 6, as in the preceding embodiment, the base resistance Rb of the parasitic transistor can be made great to sharply reduce the supply of current thereto so that the original transistor can be normally operated. Moreover, the emitter input terminal can be commonly disposed.

While this invention has been exemplified above, the examples can be further modified on the basis of the technical idea of this invention. For instance, the plan configuration of the base region extending along the ballast resistance portion may be altered variously, and the positions of the base contacts are not restricted to those in the foregoing example. Also, unlike the foregoing examples, the present invention can also be practical by forming only one emitter region in a single base region with the base region surrounding the emitter region on the front surface side at a small width. This invention is also applicable to a PNP-type transistor in which the conductivity types of the respective semiconductor regions above described are inverted.

As set forth above, according to this invention, the base region is formed to be narrow at the main surface side along the emitter ballast resistance portion. Therefore, the base resistance of the parasitic transistor can be made great to reduce current flowing thereto, and current can effectively flow to the original transistor portion rather than the parasitic transistor. Moreover, the current crowding can be prevented by the function of the emitter ballast resistance portion. It is accordingly possible to increase the breakdown strength of the transistor and to provide a semiconductor device which is especially as a power transistor.

It is to be understood that the above-described arrangements are simply illustrative of the application of the principles of this invention. Numerous other arrangements may be readily devised by those skilled in the art which embody the principles of the invention and fall within its spirit and scope.

I claim:

1. In a semiconductor device which has a first semiconductor region of a first conductivity type extending from a principal surface into a semiconductor body, a second semiconductor region of a second conductivity type selectively formed within said first semiconductor region to be surrounded by the first semiconductor region and a third semiconductor region of the first conductivity type selectively formed within the second semiconductor region to be surrounded by the second semiconductor region as a collector region, a base region and an emitter region, respectively for said semiconductor device, said semiconductor device characterized in that said third semiconductor region includes a transistor operation portion, an electrode connection portion, and a ballast resistance portion located between said transistor operation portion and said electrode connection portion, wherein the lateral width of said second semiconductor region surrounding said ballast resistance portion is smaller than the lateral width of said second semiconductor region surrounding said electrode connection portion.

2. A semiconductor device according to claim 1, wherein electrodes are respectively on the surfaces of said transistor operation portion and said electrode connection portion.

3. A semiconductor device according to claim 1, wherein a fourth semiconductor region of said first conductivity type serving as an emitter region is selectively formed within said second semiconductor region in a manner to be spaced from said third semiconductor region, and said fourth semiconductor region includes a transistor operation portion, an electrode connection portion, and a ballast resistance portion located between said transistor operation portion and said electrode connection portion, and wherein the lateral width of said second semiconductor region surrounding said ballast resistance portion of said fourth semiconductor region is smaller than the lateral width of said second semiconductor region surrounding said electrode connection portion of said fourth semiconductor region.

4. A semiconductor device according to claim 3, wherein an electrode is on the surface of said second semiconductor region between said transistor operation portions of said third and fourth semiconductor regions.

5. In a semiconductor device which has a first semiconductor region of a first conductivity type extending from a principal surface into a semiconductor body, a second semiconductor region of a second conductivity type selectively formed within said first semiconductor region to be surrounded by the first semiconductor region, and a third semiconductor region of the first conductivity type selectively formed within said second semiconductor region to be surrounded by the second semiconductor region as a collector region, a base region and an emitter region, respectively for said semiconductor device, said semiconductor device characterized in that said third semiconductor region includes a pair of transistor operation portions separated from one another by a portion of said second semiconductor region, a pair of ballast resistance portions respectively coupled to said pair of transistor operation portions, said pair of ballast resistance portions being separated from one another by a portion of said second semiconductor region, and a common electrode connection portion coupled to said pair of ballast resistance portions, wherein a part of said first semiconductor region extends to said one principal surface of said semiconductor body between said ballast resistance portions so that the combined lateral width of said second semiconductor region surrounding said pair of ballast resistance portions is less than the total lateral width of said second semiconductor region surrounding said common electrode connection portion.

6. A semiconductor device according to claim 5, wherein electrodes are respectively on the surface of said portion of said second semiconductor region between said transistor operation portions and on the surface of said common electrode connection portion.

7. A semiconductor device characterized in that a plurality of base regions are selectively formed to be separated from one another in a collector region, that a plurality of emitter regions each having an emitter ballast resistance portion are formed in said each base region, said each base region has a reduced lateral width surrounding said emitter ballast resistance portion, and that an electrode common to the respective emitter regions is formed.

8. A semiconductor device usable as a transistor wherein a first semiconductor region of a first conductivity type, a second semiconductor region of a second conductivity type selectively formed within the first semiconductor region and a third semiconductor region of the first conductivity type selectively formed within the second semiconductor region are respectively used as a collector region, a base region and an emitter region for said transistor, said semiconductor device characterized in that said third semiconductor region includes an original transistor operation portion, a terminal side portion, and a ballast resistance portion located between said original transistor operation portion and said terminal side portion, wherein said second semiconductor region includes a first base contact portion which is adjacent to said transistor operation portion and a second base portion adjacent to said ballast resistance portion, and further wherein the lateral width of said second base portion is less than the lateral width of said first base contact portion.

9. In a semiconductor device which has a first semiconductor region of a first conductivity type extending from a principal surface into a semiconductor body, a second semiconductor region of a second conductivity type selectively formed in said first semiconductor region to be surrounded by the first semiconductor region and a third semiconductor region of the first conductivity type selectively formed in said second semiconductor region to be surrounded by the second semiconductor region as a collector region, a base region and an emitter region, respectively for said semiconductor device, said semiconductor device characterized in that said third semiconductor region includes a transistor operation portion, an electrode connection portion, and a ballast resistance portion located between said transistor operation portion and said electrode connection portion, wherein a parasitic transistor is formed by said electrode connection portion and said first and second semiconductor and wherein the lateral width of said second semiconductor region surrounding said ballast resistance portion is smaller than the lateral width of said second semiconductor region surrounding said electrode connection portion to provide a highly resistive base connection to said parasitic transistor.

10. A semiconductor device according to claim 1, 8 or 9, wherein the lateral width of said ballast resistance portion is less than the lateral width of said transistor operation portion.

11. A semiconductor device according to claim 1, 8 or 9, wherein the lateral width of said ballast resistance portion is equal to the lateral width of said transistor operation portion.

12. A semiconductor device according to claim 5, wherein the lateral widths of said ballast resistance portions are equal to the lateral widths of said transistor operation portions.

13. A semiconductor device according to claim 5, wherein the lateral widths of said ballast resistance portions are less than the lateral widths of said transistor operation portions.

* * * * *